(12) United States Patent
Litzinger et al.

(10) Patent No.: US 11,002,775 B2
(45) Date of Patent: May 11, 2021

(54) METHOD FOR MONITORING AN ELECTRICAL NETWORK

(71) Applicant: SIEMENS AKTIENGESELLSCHAFT, Munich (DE)

(72) Inventors: Andreas Litzinger, Fuerth (DE); Stefan Piel, Essen (DE)

(73) Assignee: Siemens Aktiengesellschaft, Munich (DE)

( * ) Notice: Subject to any disclaimer, the term of this patent is extended or adjusted under 35 U.S.C. 154(b) by 138 days.

(21) Appl. No.: 16/369,230

(22) Filed: Mar. 29, 2019

(65) Prior Publication Data

US 2019/0302158 A1 Oct. 3, 2019

(30) Foreign Application Priority Data

Mar. 29, 2018 (EP) .................................... 18164941

(51) Int. Cl.
| | | |
|---|---|---|
| *G01R 25/00* | (2006.01) | |
| *G01R 31/08* | (2020.01) | |
| *H02J 13/00* | (2006.01) | |
| *H02J 3/04* | (2006.01) | |
| *H02J 3/38* | (2006.01) | |

(52) U.S. Cl.
CPC ......... *G01R 25/005* (2013.01); *G01R 31/086* (2013.01); *H02J 3/04* (2013.01); *H02J 13/0006* (2013.01); *H02J 3/388* (2020.01)

(58) Field of Classification Search
CPC .. G01R 25/005; G01R 31/086; G01R 21/133; G01R 19/2513; H02J 13/0006; H02J 3/24; H02J 3/00; H02J 3/04; H02J 3/388; H02J 3/383; H02J 3/381; G06F 19/00; H02H 7/122

See application file for complete search history.

(56) References Cited

U.S. PATENT DOCUMENTS 5,686,766 A * 11/1997 Tamechika ................ H02J 5/00
307/43
6,429,546 B1 * 8/2002 Ropp ....................... H02J 3/386
307/31

(Continued)

FOREIGN PATENT DOCUMENTS

EP 2806280 A1 11/2014

OTHER PUBLICATIONS

Ohno T et al., "Islanding Protection System Based on Synchronized Phasor Measurements and its Operational Experiences", 2008, pp. 1-5.

*Primary Examiner* — Vinh P Nguyen
(74) *Attorney, Agent, or Firm* — Laurence Greenberg; Werner Stemer; Ralph Locher

(57) ABSTRACT

A method monitors an electrical energy supply network or a subnetwork of the energy supply network. Measurement values detected at at least two measurement points of the energy supply network or subnetwork are evaluated. More specifically, phase angle values are evaluated as the measurement values or phase angle values determined using the measurement values are evaluated. A check is carried out based on the phase angle values to determine whether the energy supply network or the subnetwork is operating synchronously, and, in the event of an asynchronism identified based on the phase angle values, an island identification signal to be generated.

14 Claims, 2 Drawing Sheets

(56) References Cited

U.S. PATENT DOCUMENTS

| | | | |
|---|---|---|---|
| 9,077,208 B2* | 7/2015 | Bickel | H02J 3/24 |
| 9,124,095 B1* | 9/2015 | Barron | H02M 5/4585 |
| 9,293,949 B2* | 3/2016 | Trudnowski | H02J 13/0006 |
| 9,331,487 B2* | 5/2016 | Yuan | H02J 3/381 |
| 9,520,819 B2* | 12/2016 | Barker | H02P 9/007 |
| 9,804,209 B2 | 10/2017 | Litzinger et al. | |
| 9,997,920 B2* | 6/2018 | Bhowmik | H02J 3/381 |
| 2018/0152022 A1* | 5/2018 | Manson | H02J 9/02 |

* cited by examiner

METHOD FOR MONITORING AN ELECTRICAL NETWORK

CROSS-REFERENCE TO RELATED APPLICATION

This application claims the priority, under 35 U.S.C. § 119, of European application EP 18164941.9, filed Mar. 29, 2018; the prior application is herewith incorporated by reference in its entirety.

BACKGROUND OF THE INVENTION

Field of the Invention

The invention relates to a method for monitoring an electrical energy supply network or a subnetwork of the energy supply network, in particular a subnetwork of the energy supply network determined in advance based on another method, wherein measurement values detected at at least two measurement points of the energy supply network or subnetwork are evaluated.

Such a method is known from U.S. Pat. No. 9,804,209 B2. In the previously known method, frequency values and frequency change values are detected at various measurement points within an energy supply network and evaluated in order to identify an asynchronism within the energy supply network and a formation of subnetworks or islands, which are each individually synchronous to a prescribed extent.

SUMMARY OF THE INVENTION

The invention is based on the object of specifying a method for monitoring a network that provides reliable results with respect to island formation in a particularly simple manner.

This object is achieved according to the invention by way of a method having the features as claimed in the independent patent claim. Advantageous configurations of the method according to the invention are specified in dependent claims.

Accordingly, provision is made according to the invention for phase angle values to be evaluated as measurement values or phase angle values determined using the measurement values to be evaluated, for a check to be carried out based on the phase angle values to determine whether the energy supply network or the subnetwork is operating synchronously, and, in the event of an asynchronism identified based on the phase angle values, for an island identification signal to be generated.

A substantial advantage of the method according to the invention can be regarded as that of being able to make a reliable statement about a possible asynchronism within a network or subnetwork and possible island formation purely based on phase angle values and therefore in a very rapid manner. Island formation can also advantageously be identified at very low frequency deviations, the island formation not always being identified in certain circumstances in the method described at the beginning based on frequency values and frequency change values.

Phase angle values of measurement phasors, in particular voltage phasors, are preferably evaluated as measurement values.

Phase angle values of conductor voltage phasors or positive phase-sequence system voltage phasors are particularly preferably evaluated as measurement values.

In the event of an asynchronism identified based on the phase angle values, synchronously operating islands within the energy supply network or the respective subnetwork are preferably determined.

The island identification signal is preferably generated when the phase angle difference between two phase angle values exceeds a prescribed alarm threshold value.

It is considered to be particularly advantageous when the phase angle values are sorted so as to form a sorted phase angle order, proceeding from the largest or smallest phase angle value—subsequently referred to as starting phase value—of the sorted phase angle order, the difference from the subsequent phase angle value in the phase angle order, that is to say the second-largest or second-smallest phase angle value, is determined. The island identification signal is generated when the phase angle difference between the starting phase value and the subsequent phase angle value exceeds a prescribed alarm threshold value in terms of magnitude. The starting phase value and the adjacent phase angle value are considered to be synchronous when the phase angle difference between the starting phase value and the adjacent phase angle value undershoots the prescribed alarm threshold value in terms of magnitude.

As an alternative or in addition, provision can advantageously be made for the phase angle values to be sorted so as to form a sorted phase angle order and for a difference formation step and a comparison step to be carried out in each case for each phase angle value following the starting phase value according to the sorted phase angle order.

In the last-mentioned embodiment variant, it is particularly advantageous when, in the difference formation step, the phase angle difference between a reference phase value, which is the starting phase value provided it has not been replaced by another reference phase value in a preceding comparison step, and the respectively following phase angle value is determined.

With respect to the comparison step, it is particularly advantageous when, in the comparison step, the phase angle difference is compared with the alarm threshold value. The phase angle values observed during the comparison are considered to be synchronous and the method proceeds with the difference formation step for the subsequent phase angle value in the phase angle order and the same reference phase value when the phase angle difference undershoots the alarm threshold value in terms of magnitude, and the phase angle value used as the following phase angle value in the preceding difference formation step is assigned to a new island and is stipulated as a new reference phase value and the method proceeds with the difference formation step for the subsequent phase angle value in the phase angle order and the newly set reference phase value when the phase angle difference exceeds the alarm threshold value in terms of magnitude.

In a first particularly advantageous method variant, the sorting of the phase angle values preferably contains the following sorting steps:

a) presorting the phase angle values according to size so as to form a presorted phase angle order, b) checking to determine whether the phasor angle difference between the phasor angle of the measurement phasor belonging to the largest phase angle value and the phasor angle of the measurement phasor belonging to the smallest phase angle value exceeds or undershoots the alarm threshold value, c) in the event of the alarm threshold value being undershot, the phase angle order is resorted by virtue of the smallest phase angle value being increased by 360°, and d) in the event of the alarm threshold value being exceeded, the phase angle order remains unchanged and the presorted phase angle order continues to be used as the sorted phase angle order.

In the last-mentioned method variant, it is advantageous when a check is subsequently carried out in each further resorting step to determine whether the difference between the—according to the advancement of the resorting—respectively currently smallest phase angle value and the smallest phase angle value before the last resorting step exceeds the alarm threshold value, in the event of the alarm threshold value being undershot, the resorted phase angle order is resorted again by virtue of the currently smallest phase angle value being increased by 360°, and the resorting method is continued with the next resorting step and, in the event of the alarm threshold value being exceeded, the resorting is ended and the resorted phase angle order formed until this point continues to be used as the sorted phase angle order.

In the above procedure, the resorting thus takes place through resorting "upward", when described figuratively.

In a second particularly advantageous method variant, the sorting of the phase angle values preferably comprises the following sorting steps:
a) presorting the phase angle values according to size so as to form a presorted phase angle order,
b) checking to determine whether the phasor angle difference between the phasor angle of a measurement phasor belonging to the largest phase angle value and the phasor angle of a measurement phasor belonging to the smallest phase angle value exceeds or undershoots the alarm threshold value,
c) in the event of the alarm threshold value being undershot, the phase angle order is resorted by virtue of the largest phase angle value being reduced by 360°, and
d) in the event of the alarm threshold value being exceeded, the phase angle order remains unchanged and the presorted phase angle order continues to be used as the sorted phase angle order.

In the last-mentioned method variant, it is advantageous when a check is subsequently carried out in each further resorting step to determine whether the difference between the—according to the advancement of the resorting—respectively currently largest phase angle value and the largest phase angle value before the last resorting step exceeds the alarm threshold value, in the event of the alarm threshold value being undershot, the resorted phase angle order is resorted again by virtue of the currently largest phase angle value being reduced by 360°, and the resorting method is continued with the next resorting step and, in the event of the alarm threshold value being exceeded, the resorting is ended and the resorted phase angle order formed until this point continues to be used as the sorted phase angle order.

In the second particularly advantageous method variant, the resorting thus takes place through resorting "downward", when described figuratively.

The phase angle values are preferably sorted according to size so as to form a phase angle order proceeding from the smallest phase angle value in ascending order.

The order direction in which the respectively next adjacent phase angle value is used is preferably the ascending direction.

It is also considered to be advantageous when a check is carried out based on frequency values or frequency change values to determine whether the energy supply network is operating synchronously and, in the event of an asynchronism of the energy supply network, the energy supply network is divided into subnetworks, and the method described above is carried out for at least one of the subnetworks of the energy supply network.

If no asynchronism of the energy supply network is determined based on frequency values or frequency change values, the method described above can be carried out for the entire energy supply network or an arbitrarily selected subnetwork.

The invention relates furthermore to a monitoring device for monitoring an electrical energy supply network or a subnetwork of the energy supply network, wherein the monitoring device uses measurement values of at least two measurement points of the energy supply network or subnetwork.

According to the invention, with respect to such a monitoring device, provision is made for the monitoring device to be configured in such a way that it evaluates phase angle values as measurement values or determines phase angle values using the measurement values itself, checks based on the phase angle values whether the energy supply network or the subnetwork is operating synchronously, and, in the event of an asynchronism identified based on the phase angle values, generates an island identification signal.

With respect to the advantages of the monitoring device according to the invention, reference is made to the above embodiments in connection with the method according to the invention.

Other features which are considered as characteristic for the invention are set forth in the appended claims.

Although the invention is illustrated and described herein as embodied in a method for monitoring an electrical network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In the figures, the same reference signs are always used for identical or comparable components for the sake of clarity.

Figure 1:
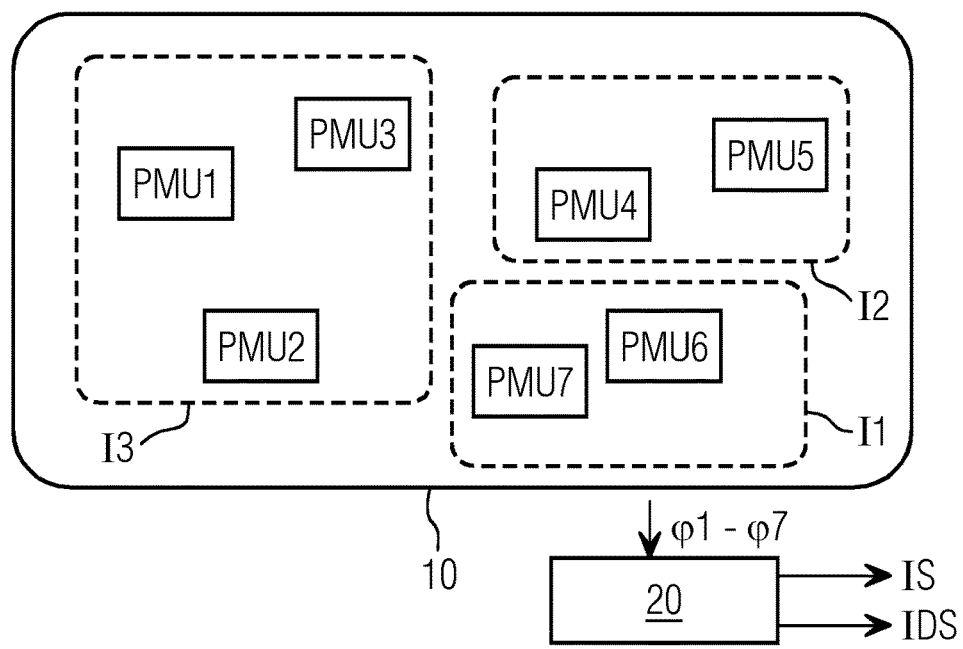
FIG. 1 is a schematic illustration of an energy supply network, which is provided with a monitoring device for identifying possible island formation within the energy supply network.

Referring now to the figures of the drawings in detail and first, particularly to FIG. 1 thereof, there is shown a schematic illustration of an energy supply network 10, which is provided with a multiplicity of measurement devices PMU1 to PMU7. The measurement devices PMU1 to PMU7 are preferably phasor measurement devices, which can detect electrical voltage phasors of conductor voltages and/or positive phase-sequence system voltages. Such measurement devices are also referred to in technical terminology as "phasor measurement units".

The measurement devices PMU1 to PMU7 are connected to a monitoring device 20 and transmit their measurement values to the monitoring device. As will be explained in even more detail further below, the measurement values are preferably phase angle values, which are characterized by the reference signs $\varphi 1$ to $\varphi 7$, and/or voltage phasors of all three phases, from which the associated positive phase-sequence system component is determined and the respective phase angle of which is subsequently used as the phase angle value. The connection for transmitting the phase angle values $\varphi 1$ to $\varphi 7$ is not illustrated in any more detail in FIG. 1 for reasons of clarity.

Figure 2:
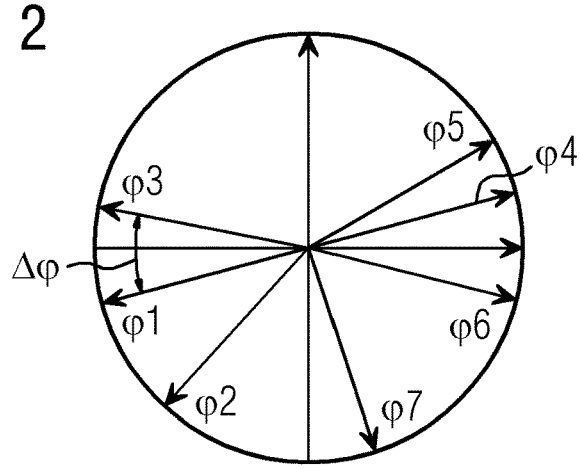
FIG. 2 is an illustration showing, by way of example, electrical voltage phasors, which are measured by measurement devices connected to the energy supply network according to FIG. 1, in the complex plane.

FIG. 2 shows, in the complex plane, by way of example, the phasor measurement values measured by the measurement devices PMU1 to PMU7 according to FIG. 1 and having the corresponding phase angle values $\varphi 1$ to $\varphi 7$.

Figure 3:
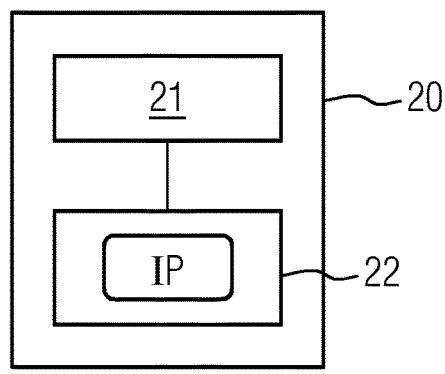
FIG. 3 is an illustration of an exemplary embodiment of a monitoring device that can be used in the arrangement according to FIG. 1.

FIG. 3 shows an exemplary embodiment of a monitoring device 20 that can be used in the arrangement according to FIG. 1 for monitoring the energy supply network 10.

The monitoring device 20 contains a computer 21 and a memory 22. An island identification program IP, which, when executed by the computer 21, enables the computer to examine the energy supply network 10 according to FIG. 1 for possible island formation, is stored in the memory 22.

Figure 4:
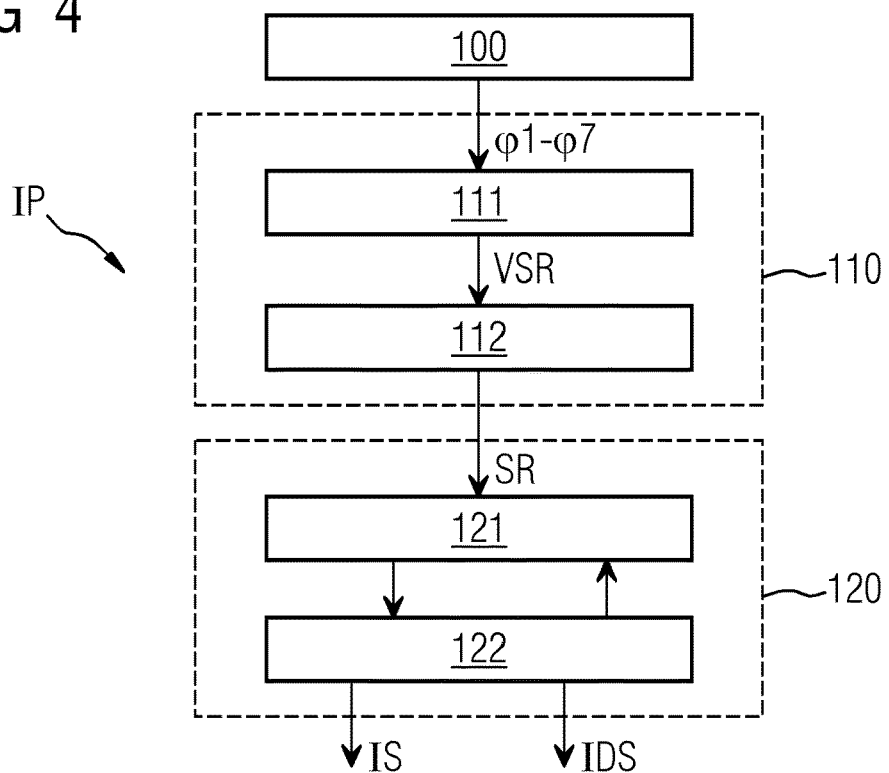
FIG. 4 is a flowchart of an exemplary embodiment of an island identification program, which is suitable for the monitoring device according to FIG. 3 for monitoring the energy supply network according to FIG. 1.

FIG. 4 shows, in the form of a flowchart, an exemplary embodiment of an island identification program IP that can be executed by the monitoring device 20 according to FIG. 3 for monitoring the energy supply network 10 according to FIG. 1.

The island identification program IP according to FIG. 4 has a detection step 100, which serves to detect the phase angle values $\varphi 1$ to $\varphi 7$ transmitted by the measurement devices PMU1 to PMU7 according to FIG. 1.

The phase angle values $\varphi 1$ to $\varphi 7$ detected in the detection step 100 can have, for example, the following values:
PMU1: $\varphi 1=-170°$
PMU2: $\varphi 2=-140°$
PMU3: $\varphi 3=+170°$
PMU4: $\varphi 4=+10°$
PMU5: $\varphi 5=+30°$
PMU6: $\varphi 6=-29°$
PMU7: $\varphi 7=-75°$ The phase angle values $\varphi 1$ to $\varphi 7$ detected in the detection step 100 reach a sorting procedure 110, which contains a presorting step 111 and a resorting procedure 112.

Within the context of the presorting step 111, the phase angle values $\varphi 1$ to $\varphi 7$ are sorted according to size so as to form a presorted phase angle order VSR. The presorted phase angle order VSR formed within the context of the presorting may, for example, look as follows:
PMU3: $\varphi 3=+170°$
PMU5: $\varphi 5=+30°$
PMU4: $\varphi 4=+10°$
PMU6: $\varphi 6=-29°$
PMU7: $\varphi 7=-75°$
PMU2: $\varphi 2=-140°$
PMU1: $\varphi 1=-170°$ The presorted phase angle order VSR reaches the resorting procedure 112, in which the presorted phase angle order is resorted so as to form a sorted phase angle order SR.

In a first step of the resorting procedure 112, a check is carried out to determine whether the phasor angle difference between the phasor angle of the measurement phasor belonging to the largest phase angle value (in this case $\varphi 3=)+170°$ and the phasor angle of the measurement phasor belonging to the smallest phase angle value (in this case $\varphi 1=)-170°$ exceeds or undershoots an alarm threshold value AS.

By way of example, it is subsequently assumed that the alarm threshold value AS is 60°.

In the event of the alarm threshold value AS being undershot—as is the case here because the phasor angle difference $\Delta\varphi$ is only 20°—the phase angle order is resorted by virtue of the smallest phase angle value (in this case $-170°$) being increased by 360°. The increase by 360° now produces a phase angle value of +190°, which is accordingly sorted in the phase angle order. The following phase angle order is now produced:
PMU1: $\varphi 1=+190°$
PMU3: $\varphi 3=+170°$
PMU5: $\varphi 5=+30°$
PMU4: $\varphi 4=+10°$
PMU6: $\varphi 6=-29°$
PMU7: $\varphi 7=-75°$
PMU2: $\varphi 2=-140°$ Owing to the resorting of the phase angle value $\varphi 1$, the phase angle value $\varphi 2=-140°$ is now the smallest phase angle value of the phase angle order. In further resorting steps, a check is now carried out in each case to determine whether or not the difference between the—according to the advancement of the resorting—respectively currently smallest phase angle value and the smallest phase angle value before the last resorting step exceeds the alarm threshold value AS.

Since—as mentioned—the phase angle value $\varphi 2=-140°$ is now the smallest phase angle value of the phase angle order, a check is accordingly carried out to determine whether the difference between the phase angle value $\varphi 2$ and the phase angle value $\varphi 1=-170°$ (before the increase by 360°) is lower than the alarm threshold value AS.

Since in this case:

$$\varphi 2 - \varphi 1 = 30° < AS$$

holds true, the phase angle order is resorted again by virtue of the phase angle value $\varphi 2$ likewise being increased by 360° and accordingly sorted into the phase angle order again. The following sorting order is now produced:
PMU2: $\varphi 2=+220°$
PMU1: $\varphi 1=+190°$
PMU3: $\varphi 3=+170°$
PMU5: $\varphi 5=+30°$
PMU4: $\varphi 4=+10°$
PMU6: $\varphi 6=-29°$
PMU7: $\varphi 7=-75°$ On account of the last resorting step, the phase angle value $\varphi 7=-75°$ is now the smallest phase angle value. Since the difference thereof from the previously resorted phase angle value $\varphi 2$ (before the increase) $-140°$ is 65° and is larger than the alarm threshold value AS, the resorting or the resorting procedure 112 is ended and the following sorted phase angle order SR is transmitted to a downstream analysis procedure 120:
PMU2: φ2=+220°
PMU1: φ1=+190°
PMU3: φ3=+170°
PMU5: φ5=+30°
PMU4: φ4=+10°
PMU6: φ6=−29°
PMU7: φ7=−75°

Within the context of the analysis procedure 120, a difference formation step 121 and a comparison step 122 are carried out in each case for each phase angle value following a prescribed starting phase value according to the sorted phase angle order SR.

By way of example, it is subsequently assumed that the smallest phase angle value of the sorted phase angle order SR, that is to say in this case the phase angle value φ7=−75°, forms the starting phase value and hence the first reference phase value.

In the difference formation step 121, first of all the phase angle difference between the starting phase value φ7 and the next largest phase angle value φ6=−29° is determined. In this case, the phase angle difference is 46°.

In the subsequent comparison step 122, a check is carried out to determine whether the phase angle difference exceeds or undershoots the alarm threshold value AS in terms of magnitude.

Since in the present case the difference between the two phase angle values φ6 and φ7 is lower than the alarm threshold value AS, it is assumed that the two phase angle values φ6 and φ7 are synchronous or are sufficiently synchronous in accordance with the synchronism criterion prescribed in the form of the alarm threshold value AS. Accordingly, the next difference formation step 121 is carried out using the same reference phase value φ7.

In the next difference formation step 121, the phase angle difference between the current reference phase value φ7 and the subsequent phase angle value φ4 is formed and compared with the alarm threshold value AS. The difference is in this case 85° and exceeds the alarm threshold value AS. On account of the alarm threshold value AS being exceeded, it is assumed that the phase angle value φ4 is no longer synchronous (or sufficiently synchronous) with the two phase angle values φ6 and φ7 and belongs to a separate island within the energy supply network 10 according to FIG. 1. The phase angle value φ4 is now stipulated as the new reference phase value and the method continues with the difference formation step 121 for the next phase angle value φ5 using the new reference phase value φ4.

In the difference formation step 121, the difference between the phase angle values φ5 and φ4 is subsequently formed and, in the subsequent comparison step 122, the determined difference |φ5−φ4| is compared with the alarm threshold value AS in terms of magnitude. In this case, it is determined that the phase angle difference is lower than the alarm threshold value, φ4 and φ5 are synchronous (or sufficiently synchronous) and belong to the same island, with the result that the phase angle value φ3 can now be examined, wherein the previously used reference phase value φ4 is retained.

The phase angle difference between the phase angle value φ3 and the reference phase value φ4 exceeds the alarm threshold value AS so that it is now determined that the phase angle value φ3 belongs to a third island within the energy supply network 10. The phase angle value φ3 is now determined as the new reference phase value and the method is continued for the subsequent phase angle value φ1.

Since the phase angle difference between φ1 and φ3 is only 20°, the phase angle value φ1 is assigned to the island of the phase angle value φ3 and the method is continued with the reference phase value φ3.

Even in the case of the last phase angle value φ2, the phase angle difference from the current reference phase value φ3 is small enough so that the phase angle value φ2 is also assigned to the island with the phase angle values φ1 and φ3.

After processing the sorted phase angle order SR, the analysis procedure 120 therefore arrives at the result that an island identification signal IS, which indicates island formation within the energy supply network 10, is to be generated.

Furthermore, the analysis procedure 120 generates an island dataset IDS, which indicates that there is a total of three islands or three subnetworks within the energy supply network 10, which each individually operate synchronously (or sufficiently synchronously).

The measurement devices PMU1 to PMU7 are assigned here to the following islands or subnetworks (see FIG. 1):
Island I1: PMU7 and PMU6
Island I2: PMU4 and PMU5
Island I3: PMU3, PMU1 and PMU2.

The assignment of the measurement devices PMU1 to PMU7 to islands, said assignment being stipulated in the island dataset IDS, is dependent on the starting phase value with which the analysis procedure 120 is started. In the case of the above exemplary embodiment, the phase angle value φ7 was assumed to be the starting phase value. Alternatively, if the largest phase angle value φ2 of the sorted phase angle order SR were to be selected as the starting phase value, the following assignment of the measurement devices PMU1 to PMU7 would be produced:
Island I1: PMU2, PMU1 and PMU3
Island I2: PMU5, PMU4 and PMU6
Island I3: PMU7.

It can be seen that three islands are identified even in the case of this starting phase value.

The selection of the starting phase value for the analysis procedure 120 is otherwise arbitrary; instead of the largest phase angle value or the smallest phase angle value, an average phase value can also be selected.

Figure 5:
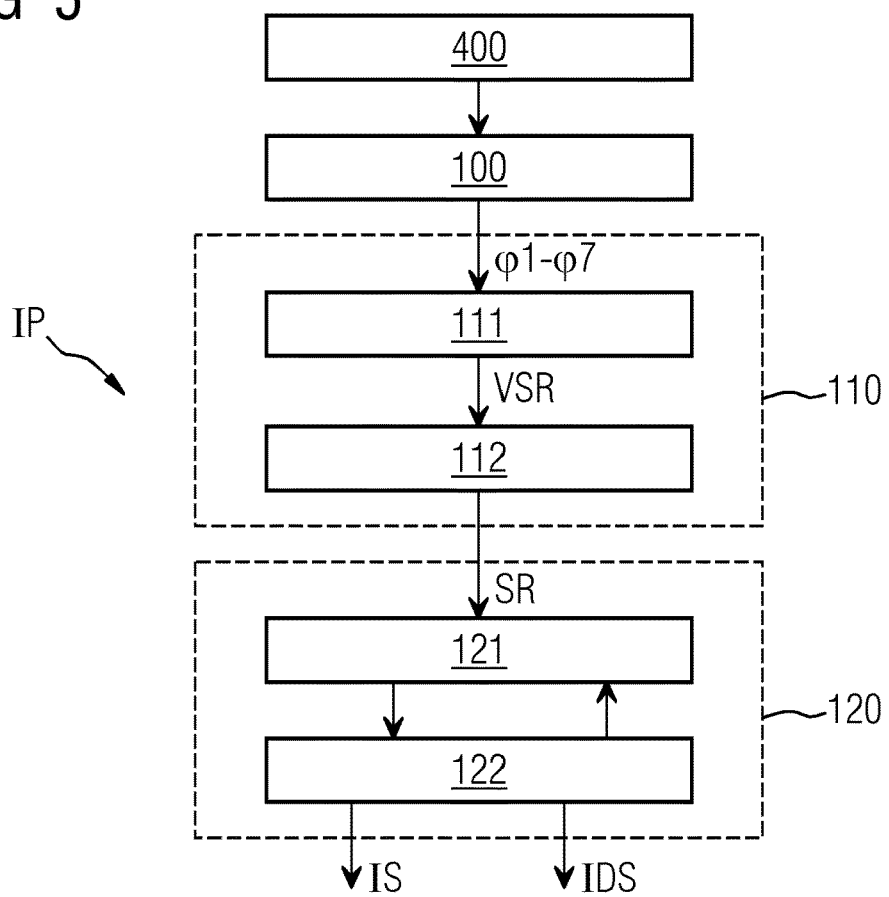
FIG. 5 is a flowchart of a further exemplary embodiment of an island identification program, which is suitable for the monitoring device according to FIG. 3 for monitoring the energy supply network according to FIG. 1.

FIG. 5 shows a further exemplary embodiment of an island identification program IP, which can be implemented by the computer 21 according to FIG. 3 for identifying island formation within an energy supply network 10 according to FIG. 1.

In contrast to the exemplary embodiment according to FIG. 4, the island identification program IP according to FIG. 5 also has a frequency and/or frequency change evaluation module 400, which is implemented before the execution of the detection step 100 and first of all carries out a precheck to determine whether frequency values and/or frequency change values of the measurement devices PMU1 to PMU7 suggest an asynchronism or island formation within the energy supply network 10 according to FIG. 1.

It is advantageous when the subsequent analysis of the phase angle values of the measurement devices PMU1 to PMU7 is carried out exclusively when it is determined, within the context of the execution of the frequency and/or frequency change evaluation module 400, that island formation is expected to have taken place. In this case, the synchronous subnetworks identified by the frequency and/or frequency change evaluation module 400 are preferably each individually analyzed further for islands within the respective subnetworks, as has been explained in connection with FIG. 4.

As an alternative, it is possible to carry out the check of the phase angle values independently of the output of the frequency and/or frequency change evaluation module 400, as has been explained above in connection with FIG. 4. In this case, possible island formation can be identified even in the case of very low frequency deviations.

In the exemplary embodiments according to FIGS. 1 to 5, the phase angle values have been sorted in ascending order; of course, it is also possible to sort the phase angle values in the opposite order. In this case, the other steps according to FIGS. 4 and 5 can be carried out in an analogous manner.

Although the invention has been illustrated and described in more detail by way of preferred exemplary embodiments, the invention is not restricted by the disclosed examples and other variations can be derived therefrom by a person skilled in the art without departing from the scope of protection of the invention.

The following is a summary list of reference numerals and the corresponding structure used in the above description of the invention:

10 Energy supply network
20 Monitoring device
21 Computer
22 Memory
100 Detection step
110 Sorting procedure
111 Presorting step
112 Resorting procedure
120 Analysis procedure
121 Difference formation step
122 Comparison step
400 Frequency and/or frequency change evaluation module
AS Alarm threshold value
IDS Island dataset
I1-I3 Synchronous islands
IP Island identification program
PMU1-PMU7 Measurement devices
SR Sorted phase angle order
VSR Presorted phase angle order
φ1-φ7 Phase angle values

The invention claimed is:

1. A method for monitoring an electrical energy supply network or a subnetwork of the electrical energy supply network, which comprises the steps of:
    evaluating measurement values detected at at least two measurement points of the electrical energy supply network or the subnetwork by evaluating phase angle values as the measurement values or the phase angle values being determined from the measurement values, the evaluating step includes the following substep of:
        sorting the phase angle values so as to form a sorted phase angle order proceeding from a largest or smallest phase angle value, subsequently referred to as a starting phase value, of the sorted phase angle order;
        determining a difference from an adjacent phase angle value in the phase angle order, that is to say a second-largest or second-smallest phase angle value; and
        generating an island identification signal, indicating an event of asynchronism, when a phase angle difference between the starting phase value and the adjacent phase angle value exceeds a prescribed alarm threshold value in terms of magnitude, the starting phase value and the adjacent phase angle value are considered to be synchronous when the phase angle difference between the starting phase value and the adjacent phase angle value undershoots the prescribed alarm threshold value in terms of magnitude; and
    carrying out a check based on the phase angle values to determine whether the electrical energy supply network or the subnetwork is operating synchronously.

2. The method according to claim 1, wherein the phase angle values of the measurement values are phase angle values of measurement phasors.

3. The method according to claim 1, wherein the phase angle values of the measurement values are phase angle values of conductor voltage phasors or positive phase-sequence system voltage phasors.

4. The method according to claim 1, which further comprises determining synchronously operating islands within the electrical energy supply network or the subnetwork in the event of the asynchronism being identified based on the phase angle values.

5. The method according to claim 1, wherein the step of the sorting of the phase angle values comprises the following sorting steps:
    presorting the phase angle values according to size so as to form a presorted phase angle order;
    checking to determine whether a phasor angle difference between a phasor angle of a measurement phasor belonging to the largest phase angle value and the phasor angle of the measurement phasor belonging to the smallest phase angle value exceeds or undershoots the alarm threshold value;
    resorting the phase angle order by virtue of the smallest phase angle value being increased by 360° in an event of the alarm threshold value being undershot; and
    maintaining the sorted phase angle order to remain unchanged and the presorted phase angle order continues to be used as the sorted phase angle order in the event of the alarm threshold value being exceeded.

6. The method according to claim 5, wherein:
    in an event of successful resorting, a check is subsequently carried out in each further resorting step to determine whether a difference between a, according to an advancement of the resorting, respectively currently smallest phase angle value and the smallest phase angle value before a last resorting step exceeds the alarm threshold value;
    in the event of the alarm threshold value being undershot, the resorted phase angle order is resorted again by virtue of the currently smallest phase angle value being increased by 360°, and the resorting method is continued with a next resorting step; and
    in the event of the alarm threshold value being exceeded, the resorting is ended and the resorted phase angle order formed until this point continues to be used as the sorted phase angle order.

7. The method according to claim 1, wherein the step of the sorting of the phase angle values comprises the following sorting steps:
    presorting the phase angle values according to size so as to form a presorted phase angle order;
    checking to determine whether a phasor angle difference between a phasor angle of a measurement phasor belonging to the largest phase angle value and the phasor angle of the measurement phasor belonging to the smallest phase angle value exceeds or undershoots the alarm threshold value;

resorting the phase angle order by virtue of the largest phase angle value being reduced by 360° in the event of the alarm threshold value being undershot; and maintaining the phase angle order to remain unchanged and the presorted phase angle order continues to be used as the sorted phase angle order in the event of the alarm threshold value being exceeded.

8. The method according to claim 7, wherein:

in the event of successful resorting, a check is subsequently carried out in each further resorting step to determine whether a difference between a, according to an advancement of the resorting, respectively currently largest phase angle value and the largest phase angle value before a last resorting step exceeds the alarm threshold value;

in the event of the alarm threshold value being undershot, the resorted phase angle order is resorted again by virtue of a currently largest phase angle value being reduced by 360° and a resorting method is continued with a next resorting step; and in the event of the alarm threshold value being exceeded, the resorting is ended and a resorted phase angle order formed until this point continues to be used as the sorted phase angle order.

9. The method according to claim 1, wherein:

the phase angle values are sorted according to size so as to form a phase angle order proceeding from a smallest phase angle value in ascending order; and/or an order direction in which a respectively next adjacent phase angle value is used is an ascending direction.

10. The method according to claim 1, which further comprises:

carrying out a check based on frequency values or frequency change values as the measurement values to determine whether the electrical energy supply network is operating synchronously and, in the event of the asynchronism of the electrical energy supply network, the electrical energy supply network is divided into subnetworks; and the method according to claim 1 is carried out for at least one of the subnetworks of the electrical energy supply network.

11. The method according to claim 1, wherein the phase angle values of the measurement values are phase angle vales of voltage phasors.

12. A method for monitoring an electrical energy supply network or a subnetwork of the electrical energy supply network, which comprises the steps of:

evaluating measurement values detected at at least two measurement points of the electrical energy supply network or the subnetwork by evaluating phase angle values as the measurement values or the phase angle values being determined from the measurement values, the evaluating step includes the following substep of:

sorting the phase angle values so as to form a sorted phase angle order; and carrying out a difference formation step and a comparison step in each case for each phase angle value following a starting phase value according to the sorted phase angle order;

carrying out a check based on the phase angle values to determine whether the electrical energy supply network or the subnetwork is operating synchronously; and generating an island identification signal in an event of an asynchronism identified based on the phase angle values.

13. The method according to claim 12, wherein:

in the difference formation step, a phase angle difference between a reference phase value, which is the starting phase value provided it has not been replaced by another reference phase value in a preceding comparison step, and a respectively following phase angle value is determined; and in the comparison step the phase angle difference is compared with an alarm threshold value, and the phase angle values observed during the comparison are considered to be synchronous and the method proceeds with the difference formation step for an adjacent phase angle value in the sorted phase angle order and a same reference phase value when the phase angle difference undershoots the alarm threshold value in terms of magnitude; and a phase angle value used as the adjacent phase angle value in a preceding difference formation step is assigned to a new island and is stipulated as a new reference phase value and the method proceeds with the difference formation step for the adjacent phase angle value in the sorted phase angle order and a newly set reference phase value when the phase angle difference exceeds the alarm threshold value in terms of the magnitude.

14. A monitoring device for monitoring an electrical energy supply network or a subnetwork of the electrical energy supply network, the monitoring device comprising:

the monitoring device is configured to use measurement values of at least two measurement points of the electrical energy supply network or the subnetwork; and the monitoring device is configured in such a way that the monitoring device evaluates phase angle values as the measurement values or determines phase angle values using the measurement values itself, the monitoring device checks based on the phase angle values whether the electrical energy supply network or the subnetwork is operating synchronously, and, in an event of an asynchronism identified based on the phase angle values, generates an island identification signal, said monitoring device performs the substeps of:

sorting the phase angle values so as to form a sorted phase angle order proceeding from a largest or smallest phase angle value, subsequently referred to as a starting phase value, of the sorted phase angle order;

determining a difference from an adjacent phase angle value in the phase angle order, that is to say a second-largest or second-smallest phase angle value; and generating an island identification signal, indicating an event of asynchronism, when a phase angle difference between the starting phase value and the adjacent phase angle value exceeds a prescribed alarm threshold value in terms of magnitude, the starting phase value and the adjacent phase angle value are considered to be synchronous when the phase angle difference between the starting phase value and the adjacent phase angle value undershoots the prescribed alarm threshold value in terms of magnitude.

* * * * *